(12) United States Patent
Lin et al.

(10) Patent No.: US 6,233,150 B1
(45) Date of Patent: May 15, 2001

(54) MEMORY MODULE ASSEMBLY

(75) Inventors: Pao-Lung Lin, Taipei; Nien-Tien Cheng, Tao-Yuan; Eric Liu, Taipei, all of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/427,144

(22) Filed: Oct. 25, 1999

(30) Foreign Application Priority Data

Dec. 28, 1998 (TW) .................................................. 87221620

(51) Int. Cl.$^7$ ....................................................... H05K 7/20
(52) U.S. Cl. .......................... 361/704; 361/702; 361/717; 361/719; 257/713; 257/719; 165/80.3; 165/165; 174/15.1; 174/16.3
(58) Field of Search ............................ 361/600, 702–704, 361/707, 710, 714–715, 719, 720, 723, 727, 728, 752, 753, 756, 802, 816, 818; 174/16.3, 252, 15.1; 312/223.1, 223.2; 165/80.2, 80.3, 80.4, 185; 29/467, 468, 240, 758, 760, 834, 840, 842; 257/706–727

(56) References Cited

U.S. PATENT DOCUMENTS

| | | | | |
|---|---|---|---|---|
| 4,658,334 | * | 4/1987 | McSparran et al. ................. | 361/415 |
| 4,739,453 | * | 4/1988 | Kurokawa ............................ | 361/424 |
| 5,023,754 | * | 6/1991 | Aug et al. ............................ | 361/414 |
| 5,109,318 | * | 4/1992 | Funari et al. ........................ | 361/388 |
| 5,208,732 | * | 5/1993 | Baudouin et al. ................... | 361/386 |
| 5,252,782 | * | 10/1993 | Cantrell et al. ..................... | 174/35 R |
| 5,268,815 | * | 12/1993 | Cipolla et al. ....................... | 361/704 |
| 5,335,147 | * | 8/1994 | Weber ................................. | 361/818 |
| 5,421,079 | * | 6/1995 | Cipolla et al. ....................... | 29/760 |
| 5,450,284 | * | 9/1995 | Wekell ................................ | 361/710 |
| 5,541,448 | * | 7/1996 | Carpenter ........................... | 257/679 |
| 5,894,408 | * | 4/1999 | Stark et al. .......................... | 361/704 |

FOREIGN PATENT DOCUMENTS 1-059842A * 3/1989 (JP) .............................. H01L/23/40

* cited by examiner

Primary Examiner—Leo P. Picard
Assistant Examiner—Michael Datskovsky
(74) Attorney, Agent, or Firm—Wei Te Chung

(57) ABSTRACT

A memory module assembly comprises a memory card having a circuit board and a number of electronic components mounted on the circuit board, a pair of shells attached on opposite surfaces of the circuit board and a pair of clips securing the card and the shells together. The circuit board forms a grounding pad around three edges thereof. Correspondingly, each shell has an electrically conductive area contacting the grounding pad of the circuit board for preventing electromagnetic interference. The circuit board forms a number of openings, and each shell have a number of projections and apertures corresponding to the openings of the circuit board. The shells are positioned on the card with the projections of one shell received in the openings of the circuit board and apertures of the other shell. The clips secure the card and the shells together.

6 Claims, 2 Drawing Sheets

MEMORY MODULE ASSEMBLY

BACKGROUND OF THE INVENTION

The present invention relates to a memory module assembly, and particularly to a memory module assembly having grounding and heat-dissipating functions.

As electronic technology advances, electronic products become increasingly smaller and high speed. For example, a compact memory module can transmit signals at speeds of more than 500 MHz. Heat and electromagnetic interference result from the high speed of signal transmission. Hence, a memory module assembly providing excellent grounding, shielding, and heat transfer effects is required.

BRIEF SUMMARY OF THE INVENTION

A first object of the present invention is to provide a memory module assembly having a heat-dissipating device for rapidly transferring heat therefrom.

A second object of the present invention is to provide a memory module assembly exhibiting excellent shielding effects.

Accordingly, a memory module assembly comprises a memory card having a circuit board and a plurality of electronic components mounted on the circuit board, a pair of shells covering opposite surfaces of the circuit board and a pair of clips securing the card and the shells together. The circuit board forms a grounding pad around three edges thereof. Correspondingly, each shell has a conductive area reliably contacting the grounding pad of the circuit board for preventing electromagnetic interference. The circuit board forms a plurality of openings, and each shell provides a number of projections and apertures corresponding to the openings of the circuit board. The shells are positioned on the card with the projections of one shell received in the openings of the circuit board and the apertures of the other shell. The clips secure the card and the shells together.

Other objects, advantages and novel features of the invention will become more apparent from the following detailed description of the present embodiment when taken in conjunction with the accompanying drawings.

DETAILED DESCRIPTION OF THE INVENTION

Figure 1:
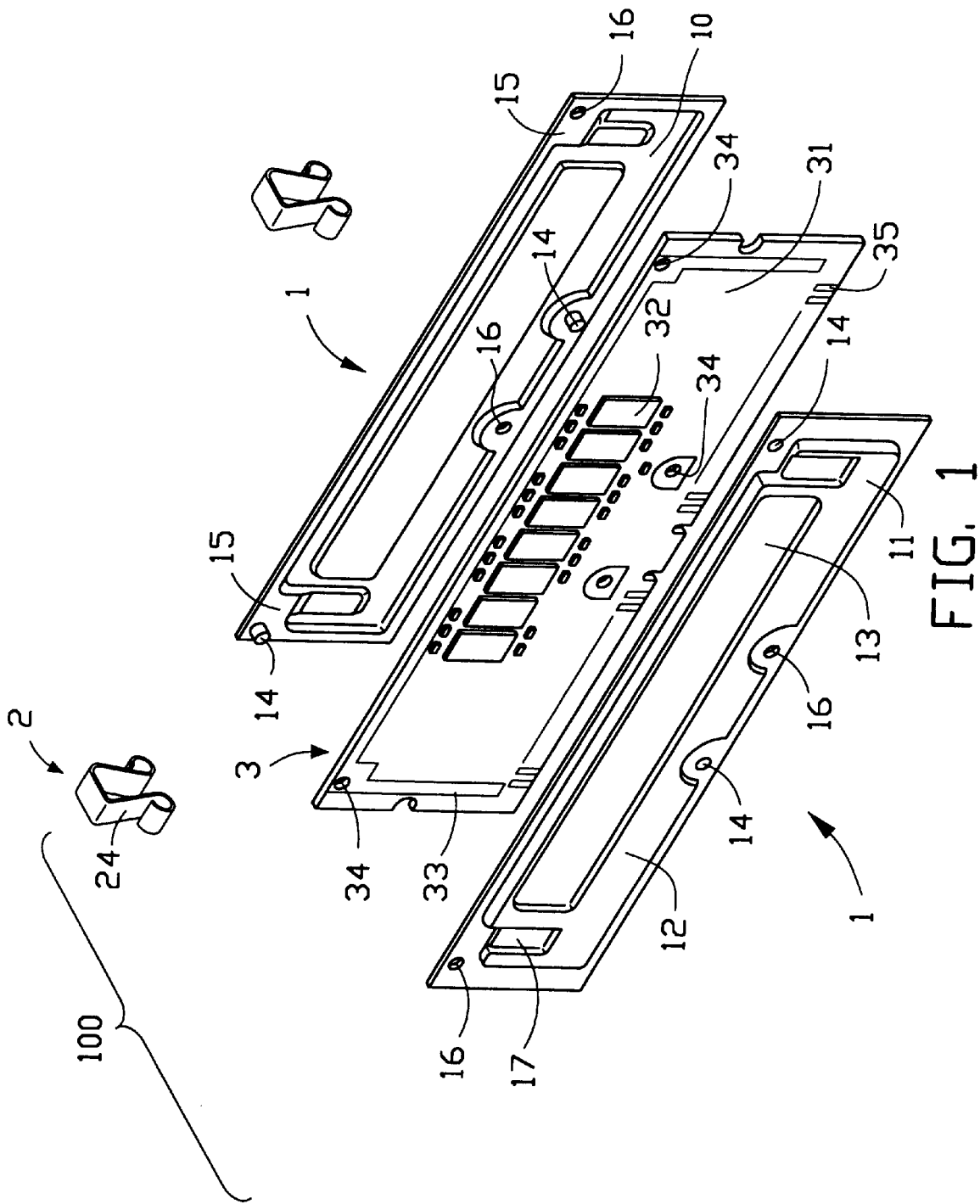
FIG. 1 is an exploded view of a memory module assembly of the present invention.
Figure 2:
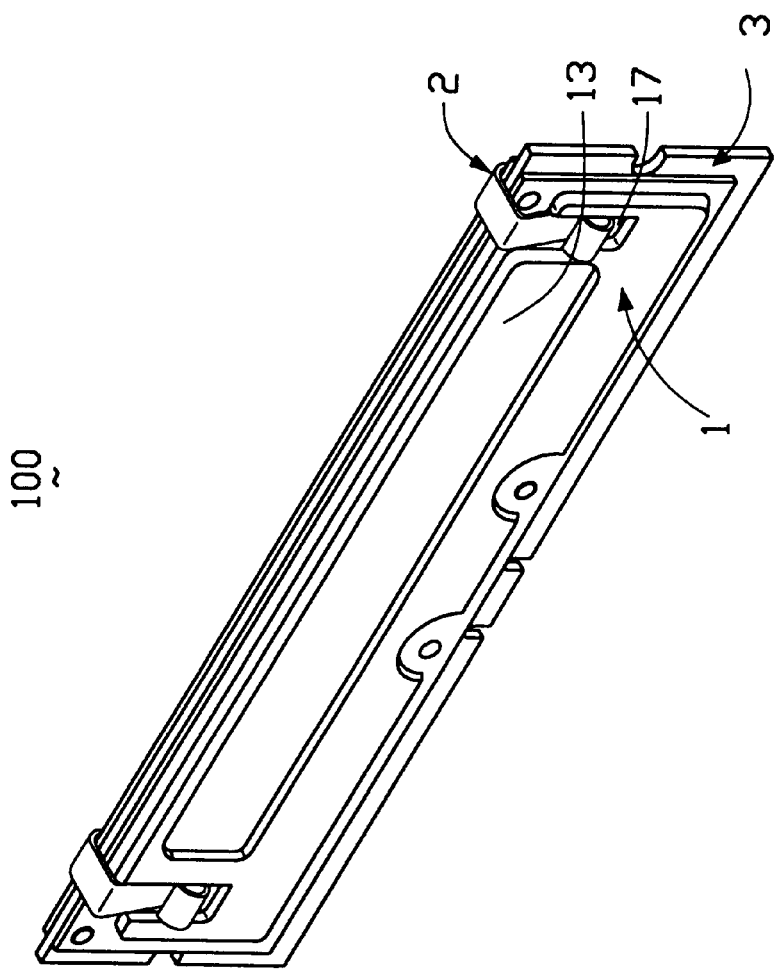
FIG. 2 is an assembled view of FIG. 1.

Referring to FIGS. 1 and 2, a memory module assembly 100 comprises a memory card 3 having a circuit board 31 and a plurality of electronic components 32 mounted thereon, a pair of shells 1 covering opposite faces of the circuit board 31 and a pair of clips 2. The circuit board 31 forms a grounding pad 33 around three edges thereof and a row of gold fingers 35 along the other edge on opposite faces thereof. The circuit board 31 further forms four openings 34 for positioning the shells 1 thereon. The openings 34 are distanced from each other for obtaining an excellent positional relationship between the circuit board 31 and the shells 1 even if the openings 34 are not accurately positioned.

Each shell 1 is manufactured from conductive and diathermanous material such as a metal plate. Each shell 1 has first and second faces 10, 11 respectively facing and opposing the card 3. Each shell 1 is stamped from the first face 10 toward the second face 11 and then stamped in a contrary direction to respectively form a high portion 12 and a contacting portion 13 contacting the electronic components 32 of the card 3 for direct heat transfer. The high portion 12 also forms a pair of recessed portions 17 at opposite ends thereof for receiving the clips 2. The shell 1 is anodized except for a conductive area 15 which contacts the grounding pad 33 of the circuit board 31. The conductive area 15 transfers electronic charges away from the shells 1 via the card 3. Each shell 1 forms a pair of projections 14 and a pair of apertures 16 in the first face 10 corresponding to the openings 34 of the circuit board. The clip 2 has a pair of inwardly bent spring arms 24.

The shells 1 are assembled to the card 3 with the projections 14 of one shell 1 received in the openings 34 of the circuit board 31 and the apertures 16 of the other shell 1. The clips 2 secure the shells 1 to the card 31 by the arms 24 thereof engaging with the recessed portions 17.

The clips 2 are not necessary if the projections 14 of the shells 1 are long enough. Thus, after the shells 1 are assembled to the card 31, free ends of the projections 14 of one shell 1 extend beyond the other shell 1 and are hit by an external tool (not shown) to rivet the shells 1 together.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A memory module assembly comprising:

a memory module including a base and a plurality of electronic components mounted on the base, the base having a grounding pad, the base defining a plurality of openings in said grounding pad; and first and second shells jointly enclosing the memory module, the shells having an electrically conductive area contacting the grounding pad of the base for preventing electromagnetic interference;

projections and apertures being formed on each shell, each projection of one shell aligning to one of the openings of the base and one corresponding aperture of the other shell, wherein said projection can be mechanically deformed such that the memory module is fixedly and reliably sandwiched therebetween;

wherein the projections extend through the corresponding openings of the grounding pad for facilitating a grounding path between first and second shells and the memory module.

2. The memory module assembly as claimed in claim 1, wherein the grounding pad is positioned around three edges of the base.

3. The memory module assembly as claimed in claim 1, wherein the shells being anodized except for the conductive area.

4. The memory module assembly as claimed in claim 1 further comprising a pair of clips, and wherein each shell forms a pair of recessed portions, the clips engaging with the recessed portions to secure the shells to the memory module.

5. The memory assembly as claimed in claim 1, wherein the shells are riveted together by the projections.

6. A memory module assembly comprising:

a memory module including a base and a plurality of electronic components mounted thereon, said base defining a plurality of openings therein;

a heat-dissipating device including a pair of shells made of diathermic material with a plurality of posts extending therefrom and through the corresponding openings of the module so as to sandwich the module therebetween; and said pair of shells defining recessed portions and at least one clip embedded therein to fixedly fasten the shells and the module together;

wherein said base includes a grounding pad in which the openings are disposed for facilitating a grounding path between said shells and said memory module.

* * * * *